(12) United States Patent
Chen et al.

(10) Patent No.: US 7,955,992 B2
(45) Date of Patent: Jun. 7, 2011

(54) METHOD OF PASSIVATING AND ENCAPSULATING CDTE AND CZT SEGMENTED DETECTORS

(75) Inventors: Henry Chen, Victoria (CA); Pinghe Lu, Victoria (CA); Salah Awadalla, Victoria (CA)

(73) Assignee: Redlen Technologies, Inc., Saanichton, BC (CA)

( * ) Notice: Subject to any disclaimer, the term of this patent is extended or adjusted under 35 U.S.C. 154(b) by 459 days.

(21) Appl. No.: 12/188,501

(22) Filed: Aug. 8, 2008

(65) Prior Publication Data
US 2010/0032579 A1 Feb. 11, 2010

(51) Int. Cl.
*H01L 21/00* (2006.01)
(52) U.S. Cl. ............ 438/778; 438/958; 438/73; 257/58; 257/E21.56; 257/E23.132
(58) Field of Classification Search .................... 438/53, 438/73, 778, 958
See application file for complete search history.

(56) References Cited

U.S. PATENT DOCUMENTS

| | | |
|---|---|---|
| 4,144,090 A | 3/1979 | Franz |
| 4,301,368 A | 11/1981 | Riihimaki |
| 4,858,856 A | 8/1989 | Cloth |
| 5,100,767 A | 3/1992 | Yanagawa et al. |
| 5,368,882 A | 11/1994 | Tran et al. |
| 5,608,188 A | 3/1997 | Choon et al. |
| 5,677,539 A | 10/1997 | Apotovsky |
| 5,905,264 A | 5/1999 | Shahar et al. |
| 5,933,706 A | 8/1999 | James et al. |
| 6,034,373 A | 3/2000 | Shahar et al. |
| 6,037,595 A | 3/2000 | Lingren |
| 6,043,106 A | 3/2000 | Mescher et al. |
| 6,046,068 A | 4/2000 | Orava et al. |
| 6,069,360 A | 5/2000 | Lund |
| 6,175,120 B1 | 1/2001 | Macgregor |
| 6,212,093 B1 | 4/2001 | Lindsey |
| 6,215,123 B1 | 4/2001 | Orava et al. |
| 6,329,658 B1 | 12/2001 | Mestais et al. |
| 6,333,504 B1 | 12/2001 | Lindgren |
| 6,410,922 B1 | 6/2002 | Spartiotis et al. |
| 6,510,195 B1 | 1/2003 | Chappo et al. |
| 6,524,966 B1 | 2/2003 | Wright et al. |
| 6,694,172 B1 | 2/2004 | Gagnon et al. |
| 6,765,213 B2 | 7/2004 | Shahar et al. |
| 6,781,132 B2 | 8/2004 | Macgregor |
| 7,037,351 B2 | 5/2006 | Li et al. |
| 7,038,288 B2 | 5/2006 | Lai et al. |
| 7,223,982 B1 | 5/2007 | Chen et al. |

(Continued)

FOREIGN PATENT DOCUMENTS
EP 1 156 347 A1 11/2001
(Continued)

OTHER PUBLICATIONS

International Search Report and Written Opinion mailed Jan. 28, 2010, in corresponding PCT/US2009/048416, 11 pages.
(Continued)

*Primary Examiner* — Jarrett J Stark
(74) *Attorney, Agent, or Firm* — The Marbury Law Group, PLLC (57) ABSTRACT

A method of forming a passivation layer comprises contacting at least one surface of a wide band-gap semiconductor material with a passivating agent comprising an alkali hypochloride to form the passivation layer on said at least one surface. The passivation layer may be encapsulated with a layer of encapsulation material.

21 Claims, 8 Drawing Sheets

U.S. PATENT DOCUMENTS

| | | |
|---|---|---|
| 7,247,860 B2 | 7/2007 | Yanagita et al. |
| 2001/0035497 A1 | 4/2001 | Montemont et al. |
| 2002/0066531 A1 | 6/2002 | Ke et al. |
| 2002/0158207 A1 | 10/2002 | Spartiotis et al. |
| 2002/0182716 A1 | 12/2002 | Weisbuch et al. |
| 2003/0034456 A1 | 2/2003 | McGregor |
| 2004/0052456 A1 | 3/2004 | Boffi et al. |
| 2005/0167606 A1 | 8/2005 | Harrison et al. |
| 2005/0199816 A1 | 9/2005 | Amemiya et al. |
| 2006/0118760 A1 | 6/2006 | Yang et al. |
| 2006/0186501 A1 | 8/2006 | Ishimura |
| 2007/0194243 A1 | 8/2007 | Chen et al. |
| 2008/0149844 A1 | 6/2008 | Chen et al. |
| 2008/0258066 A1 | 10/2008 | Chen et al. |

FOREIGN PATENT DOCUMENTS

| | | |
|---|---|---|
| JP | 2-129969 A | 5/1990 |
| JP | 11-163310 A | 6/1999 |
| JP | 2005-257437 A | 9/2005 |
| JP | 2006-237186 A | 9/2006 |

OTHER PUBLICATIONS

Burger et al., "Characterization of metal contacts and surfaces of Cadmium Zinc Telluride," Nuclear Instruments and Methods in Physics Research, 1999, A 428:8.-13.

Chattopadhyay et al., "Surface passivation of Cadmium Zinc Telluride radiation detectors by potassium hydroxide solution," Journal of Electronic Materials, Jun. 2000, 29(6):708-712.

Chen et al., "Passivation of ZnCdTe surfaces by oxidation in low energy atomic oxygen," Journal of Vacuum Science and Technology, Jan./Feb. 1999, A 17(1):97-101.

Chen et al., "Photoluminescence investigation of surface oxidation of $Cd_{0.9}Zn_{0.1}Te$ detectors," Semiconductors for Room Temperature Radiation Detector Applications II, Mat. Res. Soc. Symp. Proc., 1998, vol. 487, 65-70.

Chen et al., "Study of oxidized cadmium zinc telluride surfaces," Journal of Vacuum Science and Technology, May/Jun. 1997, A 15(3), 850-853.

Jacob et al., "Hydrogen passivation of nitrogen acceptors confined in CdZnTe quantum well structures" Journal of Applied Physics, Sep. 1, 2001, 90(5):2329-2332.

Mescher et al., "Development of Dry processing Techniques for CdZnTe surface passivation" Journal of Electronic Materials, Jun. 1999, 28(6):700-704.

Park et al., "Surface Passivation Effect on CZT-Metal Contact," IEEE Transactions on Nuclear Science, Jun. 2008, 55(3):1547-1550.

Qiang et al., "Surface passivation and electrical properties of p-CdZnTe crystal," Semicond. Sci. Technol., 2006, 21:72-75.

Rai et al., "Raman scattering study of $H_2O_2$-etched surface of $Zn_{0.1}Cd_{0.9}Te$," Mat. Res. Soc. Symposium Proceedings, 1997, 450:287-292.

Wenbin et al., "A novel two-step chemical passivation process for CdZnTe detectors," Semicond. Sci. Technol., 2005, 20:343-346.

Wenbin et al., "A novel surface passivation process for CdZnTe detector packaging," Proceeding IEEE CPMT Conference, Jul. 2004, 377-379.

Wright et al., "Evaluation of NH4F/H2O2 effectiveness as a surface passivation agent for Cd1-xZnxTe crystals" SPIE Proceeding, 2000, 4141:324, 12 pages.

Xiaoqin et al., "Surface passivation of CdZnTe wafers," Materials Science in Semiconductor Processing, 2005, 8:615-621.

METHOD OF PASSIVATING AND ENCAPSULATING CDTE AND CZT SEGMENTED DETECTORS

BACKGROUND OF THE INVENTION

The present invention relates generally to the field of semiconductor devices and particularly to radiation detectors.

SUMMARY OF THE INVENTION

In one embodiment, a method of forming a passivation layer comprises contacting at least one surface of a wide band-gap semiconductor material with a passivating agent comprising an alkali hypochloride to form the passivation layer on said at least one surface.

In another embodiment, a method of passivating a monolithic, multichannel semiconductor radiation detector comprises (a) providing a cadmium telluride or cadmium zinc telluride substrate having a segmented anode electrode array on a first surface of the substrate and a cathode electrode on a second surface of the substrate and (b) forming a passivation layer at least between the anode electrodes of the anode electrode array by contacting the first surface of the substrate with a solution comprising sodium hypochloride.

In another embodiment, a radiation detector comprises (a) a semiconductor substrate having opposing front and rear surfaces, (b) a cathode electrode located on the front surface of the semiconductor substrate (c) a plurality of anode electrodes located on the rear surface of the semiconductor substrate (d) a passivation layer comprising an oxide of cadmium telluride or an oxide of cadmium zinc telluride located on the substrate between plurality of the anode electrodes, and (e) a layer of an encapsulation material disposed above the passivation layer, where the layer of encapsulation material comprises openings extending to the anode electrodes.

DETAILED DESCRIPTION OF THE PREFERRED EMBODIMENTS

The following definitions are used herein:

Cathode electrode: the electrode on one major surface of the detector substrate where incident gamma rays or x-rays enter the detector, i.e. positioned towards the radiation source.

Anode electrodes: segmented electrode contacts located on the rear surface of the substrate, i.e. positioned away from the radiation source.

Interpixel or inter pixel: the region or gap separating pixel electrodes. For electrode configurations with non-pixellated discrete contact segments the term is equivalently applied to the gap between contact segments.

Radiation Detector Design

Radiation detectors can be configured in a variety of ways. A common configuration comprises a cathode electrode and a plurality of anode electrodes located on opposite sides of a semiconductor plate or substrate. Typically these monolithic multichannel radiation detectors have pixilated anode electrode arrays fabricated on a common semiconductor substrate by various deposition and lithography processes resulting in a gap between pixels, termed the interpixel gap or interpixel region. Each anode electrode pixel forms one of the plurality of detector channels.

In the preferred embodiments, the radiation detectors comprise a semiconductor material, such as a semiconductor material preferably comprising cadmium zinc telluride (CdZnTe or CZT) or CdTe. Although other types of semiconductor materials exemplified by lead iodide, thallium bromide, gallium arsenide or silicon may be used.

More preferred is $Cd_{(1-x)}Zn_xTe$ (where x is less than or equal to 0.5), a wide band gap ternary II-VI compound semiconductor with unique electronic properties. This type of semiconductor is useful in gamma-ray and X-ray detectors which are used as spectrometers that operate at room temperature for radiation detection, spectroscopy and medical imaging applications.

Figure 1:
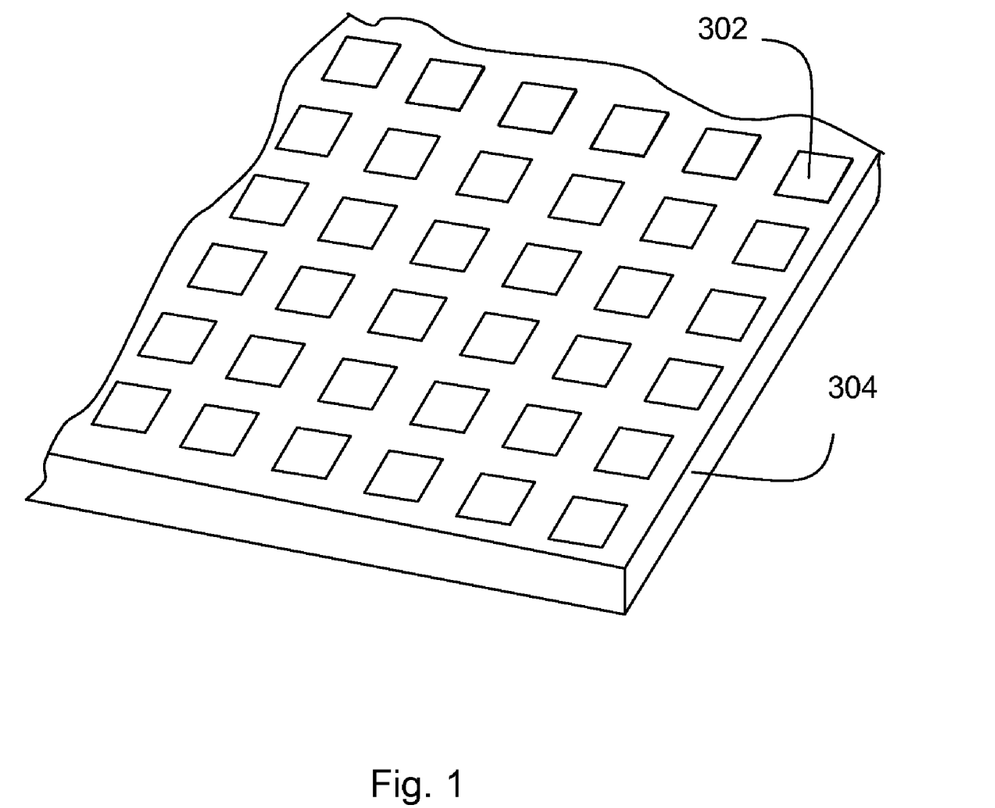
FIG. 1 is a perspective view of a CZT substrate with anode electrode pixels.

Illustrated in FIG. 1, is an example of pixellated anode electrodes 302 formed on a semiconductor substrate 304, such as a CZT substrate (also referred to as a "tile"). The cathode electrode is formed on the bottom side of the substrate 304.

FIGS. 2A-I illustrate, without any intent to limit the present embodiments, an example of steps in method of forming tri-layer metal contacts on a semiconductor substrate at positions (pixels) for defining radiation detector cells with an interpixel gap with high resistivity between the detector cells. In this example, it is assumed that the semiconductor substrate is made of cadmium zinc telluride (CdZnTe) or cadmium telluride (CdTe), although it will be appreciated that other semiconductor materials, for example lead iodide, thallium bromide, gallium arsenide or silicon, can be used. Also, it will be assumed that the metal used for the metallization layer and the contacts is gold, although it will be appreciated that other metals, alloys or other conductive materials, for example platinum or indium, could be used.

Thus, FIGS. 2A-2I are a schematic cross-sectional views from the side of a detector substrate at various stages in the formation of gold contacts on a CdZnTe substrate. The detailed features and structure at each step of the process are shown, resulting in an array of anode contact pixels on the rear surface of the CZT (drawn as facing up in this illustration), and a single cathode electrode on the front surface of the CZT tile (drawn as facing down in this illustration). In this example, two additional contact layers are added on to the pixilated primary contact layer on the rear side, for improved device assembly. The process can be applied to any array size and pixel configuration for CZT devices. A typical device size is a 20×20×5 mm detector, having 8×8 pixels or 11×11 pixels depending on the application. As a precursor to contact fabrication, the CZT wafer is polished and etched such that high quality clean crystal surfaces are prepared for the deposition process.

Figure 2A:
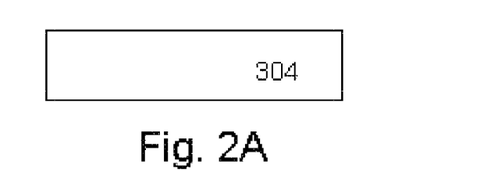
FIGS. 2A-I are schematic cross-sectional views of a method of making a detector at various stages in the formation of contacts thereon.

The direct lithography fabrication process is described with reference to FIGS. 2A-I, and for the case of the primary contact being gold, with two additional contact layers, and for simultaneous forming of the cathode contact on the opposing side of the CZT tile or substrate 304 shown in FIG. 2A.

Figure 2B:
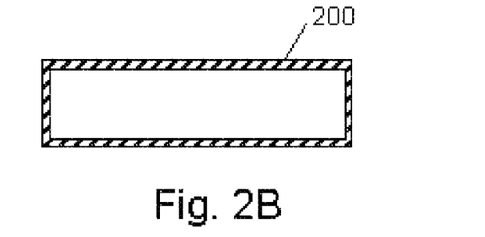

In step 1, shown in FIG. 2B a primary layer of gold 200 is deposited on the CZT tile 304. The gold layer 200 may be deposited by electroless deposition. Alternatively the gold layer 200 may be deposited by other known techniques, such as sputtering. The CZT tiles are first etched in Bromine-Methanol solution followed by methanol rinsing, as is well known. The clean CZT tiles 304 are dipped in an electroless gold solution for several minutes depositing a gold layer 200, then the tile is removed and rinsed with methanol. Typical thickness of deposition is equal or more than 100 nm. The deposited gold may be annealed at 90 deg C. for 15 minutes to increase adhesion to the substrate. An adhesion test can be done after a few hours using Scotch tape to confirm quality of the adhesion.

Figure 2C:
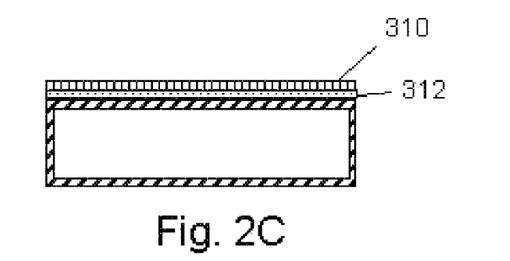

In an optional step 2 shown in FIG. 2C, two additional contact layers are deposited onto the rear side (anode side to be pixilated) of the tile, over the primary contact layer 200 on the rear side. In this example, a Ni layer 312 is deposited using sputtering or a thermal evaporation process to a thickness <100 nm and nominally 50 nm. Then another gold layer 310 is deposited using sputtering, thermal evaporation and/or an electroless process to a thickness <50 nm and nominally 20 nm. Alternative conductive contact material can be substituted for either or both of the additional contact layers.

Figure 2D:
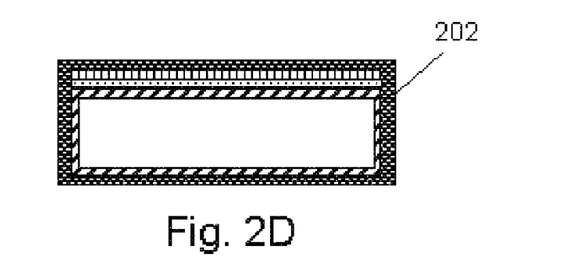

In step 3, as shown in FIG. 2D, a photoresist 202 is applied over the contact layer(s). Tiles 304 are dipped in resist, for example Shipley 1805 resist. Excessive resist is removed if necessary from the edge using a Q-tip, making sure the resist does not form any edge bead (especially on the pixilated face) as this would be detrimental for the pixel quality. Generally, the least possible amount of resist should remain on the pixilated face. The resist should be dried out for 10 minutes with the pixilated face kept up and horizontal.

The resist coating is hardened in step 4 by baking for 10 minutes at 90° C. This step is done to drive excess solvent out of the resist. The tile is now prepared for lithography exposure.

Figure 2E:
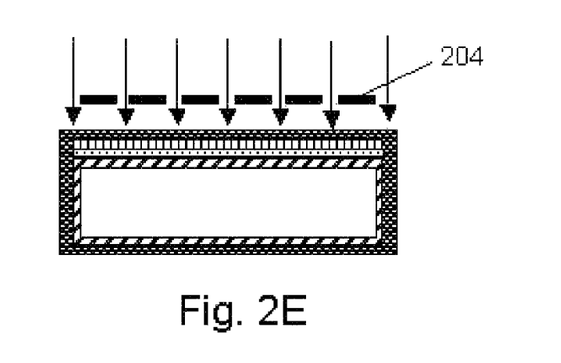

In step 5, as shown in FIG. 2E a pixel pattern is formed on the rear side of the tile 304 by photolithography. A UV mask 204 is aligned over the CZT tile surface, and the positive resist is exposed to UV. The direct lithography mask shades regions of the resist in a selected pixel pattern and exposes interpixel gaps to UV radiation. A contact mask is shown but other methods will work as well, such as proximity and projection masks. A glass plate is placed on top making sure that the glass plate is horizontal. This ensures uniform contact between the tile and the mask. For the exemplary resist, exposure by a UV lamp (365 nm wavelength) for several minutes is suitable. If desired, a negative resist may be used instead of the positive resist (in which case, the exposure mask's transparent and opaque regions are reversed).

Figure 2F:
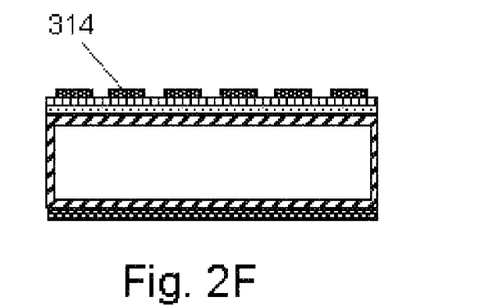

In step 6 shown in FIG. 2F, the exposed photoresist is developed. The resist developer (for example Microposit developer, MF-319) should cover the tile(s). The tiles are placed into the developer with the pixilated side facing up, developed for 2 minutes and the tile(s) are removed from the developer and rinsed in de-ionized water. The UV exposed resist is removed, in preparation for creating the interpixel gap.

In step 7 the remaining resist pixel pattern 314 is baked for 20 minutes at 90° C. This step is done to harden the resist further.

Figure 2G:
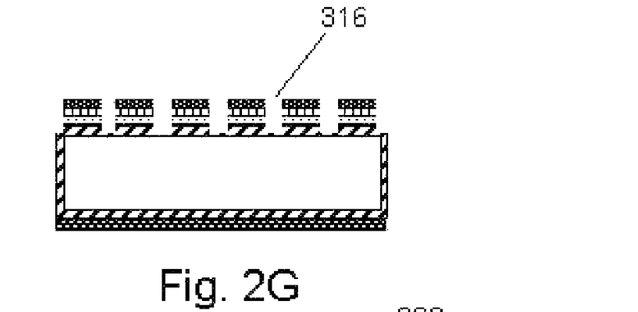

In step 8, shown in FIG. 2G, the exposed contact regions 316 (not covered by the pixel resist pattern 314) are etched. For the example contact materials, the following etching solution is suitable for etching through either just the primary contact layer or the optional three-layer contact. A 2% Br-Ethanol Glycol (BrEG) solution is prepared by pouring a 25 ml of Ethylene Glycol into a plastic beaker, then 0.5 ml of Bromine is added using a disposable pipette. Using the same pipette, the solution is mixed thoroughly until it becomes uniform. However, a different pipette or mixing device may also be used. Etching is conducted for approximately 3 minutes. This etching is done to remove unmasked interpixel contact material. To open the interpixel gap to achieve clean interpixel gaps, active spray agitation is performed. Disposable pipettes can be used to create Br-EG constant flow to agitate for better etching. However, a different pipette or agitation or mixing device may also be used. The spray etching technique should rapidly remove contact material flakes from the interpixel gaps, resulting in high interpixel resistance. The tiles are removed from the etchant and rinsed in deionized water.

Figure 2H:
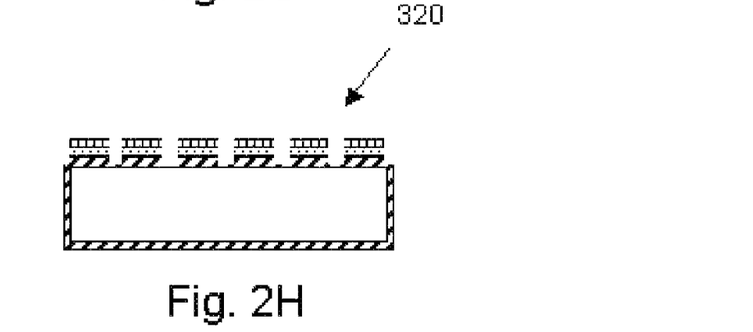

In step 9 shown in FIG. 2H, the remaining resist is stripped using an acetone bath, resulting in tile 320 with a pixel array of contacts. No photoresist therefore remains on the CdTe or CdZnTe detector since it is usually a hygroscopic material that in time would absorb humidity and deteriorate the detector performance.

The overall combination of depositing the metal layer over the entire substrate surface at once, direct photolithography and the etching process results in the improved device interpixel resistance and performance.

Figure 2I:
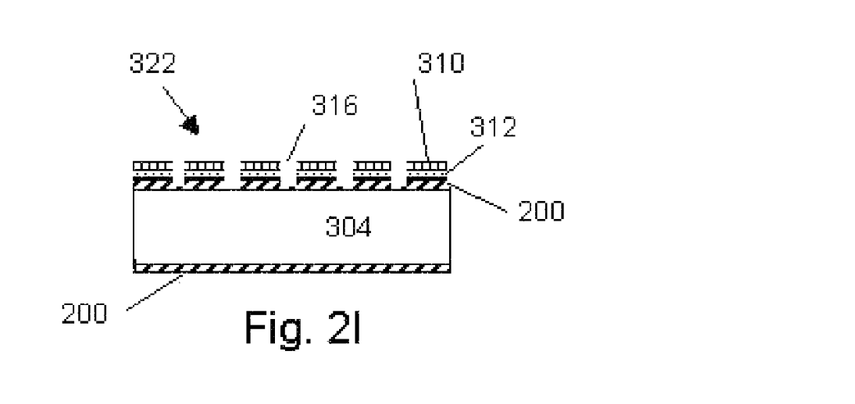

In step 10 shown in FIG. 2I, the primary contact material (in this example gold) on the sides of the fabricated CZT device 322 is removed by side polishing. For example, the side of the tile(s) are first polished with 1200 grit then with 0.3 micron as fine polish. An alternate embodiment could, in step 1, mask the sides of the CZT tile instead of depositing gold on all sides. For this reason, the side contact removal step 10 may be optional. The resulting fabricated CZT device has a cathode electrode 200 remaining on the front side, a pixilated anode electrode array formed of a primary contact layer 200, and secondary contact layers 312 and 310, separated by interpixel gaps 316. FIG. 2I illustrates the multi-layer pixels as being identical width in cross-section for illustrative purpose.

Figure 3A:
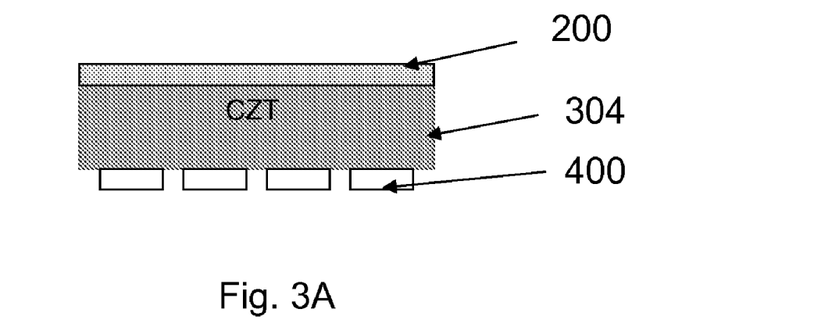
FIGS. 3A-C are schematic cross-sectional views of a method of making a detector with a housing.
Figure 3B:
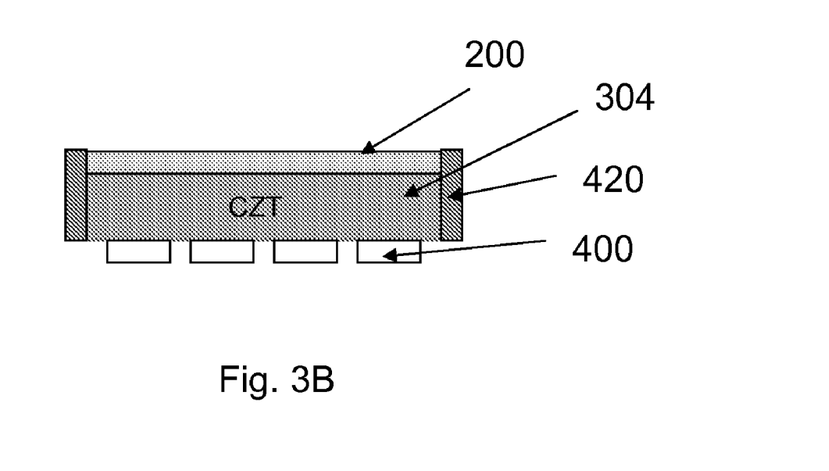

FIG. 3A shows the completed device containing the anode electrode pixels 400. Optionally, an edge coating 420 is applied to the polished side edges of the CZT tile as shown in FIG. 3B. For example, the CZT tile may be dipped in a protective coating (such as solder mask, silicone or epoxy) to cover the exposed sides and dried for at least 5 hours.

Cathode Housing (Optional)

Optionally, an electrically conductive housing may be attached to the detector cathode by (a) providing a radiation detector comprising a semiconductor substrate having opposing front and rear surfaces, a cathode electrode located on the front surface of said semiconductor substrate and a plurality of anode electrodes on the rear surface of said semiconductor substrate, (b) providing a separately formed electrically conductive housing, and (c) attaching the housing to the cathode electrode such that the housing and the cathode electrode are in electrical contact.

Figure 3C:
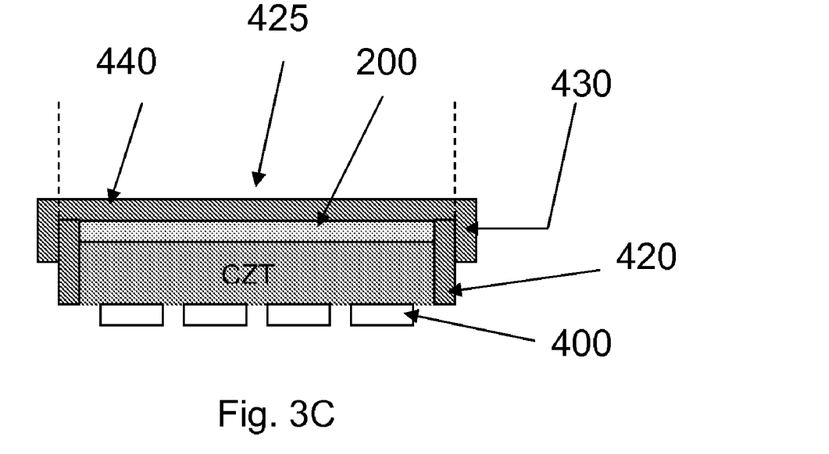

A non-limiting example of a housing is depicted in FIGS. 3A-C showing side cross-sectional views of a detector at various stages of attaching a housing thereto. Starting with FIG. 3A, a radiation detector and its basic elements, cathode electrode 200, semiconductor substrate 304 and anode electrodes 400, are shown. The detector may or may not comprise at least one of a guard ring or screening electrode. Next, an optional, electrically insulating edge coating 420, such as a solder mask, silicone (Humiseal) or UV curable epoxy is applied to edges of the substrate 304, as shown in FIG. 3B. Alternatively, this coating may be removed once a housing is formed thereon, resulting in an air gap between said housing and a side of the detector.

As shown in FIG. 3C, the electrically conductive housing is attached to the cathode and optionally the sides of the detector. In this illustration, the housing 425 comprises a top portion 440 and an optional side portion 430. The sides of the detector may or may not be glued to the edge coating 420 covering sides of the detector depending on various reasons such as for example, if one wishes to later remove the protective coating. In this example, the housing is attached to the cathode via an epoxy, although one skilled in the art may chose from other adhesives.

The electrically conductive housing 425 shields the detector from background electromagnetic fields (or magnetic fields). Additionally, device electric fields are focused using this housing. The housing is also preferably transparent to X-ray or gamma-ray radiation. Further, the housing preferably exhibits little or no oxidation in ambient air, such as under normal operating conditions of the detector. As such, the housing is most preferably a thin structure and comprises a material transparent to radiation, substantially impervious to background electromagnetic fields and exhibits little or no oxidation at ambient conditions.

For example the housing may be between about 50 microns and 100 microns thick. In some cases a metal foil is sufficient as a housing.

Based on the parameters set forth above, one skilled in the art may chose from a host of materials for constructing the housing. In general, metals and metallic alloys are preferred. Any suitable metal which does not substantially oxidize in air may be used. A non-limiting example of suitable metallic alloys includes stainless steel, brass (such Ni/Ti coated brass), NiCo alloys, NiFe alloys, NiFeCo alloys, NiFeMo alloys or NiFeCuMo alloys. A class of metal alloys termed "Mu-metals" is most preferred. Mu-metals are a type of NiFe alloy, particularly effective at screening static or low frequency magnetic fields. In some cases, the aforementioned alloys may be doped with other alloying elements, mechanically pre-treated (e.g. cold worked, hot worked etc.), chemically surface-treated (e.g. surface coating for corrosion resistance) or any combination thereof.

In some cases, the housing 425 is shaped to conform to geometry of the detector, more specifically, to geometry of the cathode, to which it is secured. Therefore, one skilled in the art may contemplate various curved or angular housing shapes given the shape of the detector. In a non-limiting example, the housing is a rectangular or circular-cross-sectioned (e.g. cylinder) shape.

When the housing is constructed to extend over (partially or completely) at least one side of the substrate, said at least one side is spaced from said housing. This gap is either empty or filled with an insulating material.

The housing 425 is attached to the cathode electrode 200 such that an electrical conduction path exists between the two. In a preferred case, the housing and the cathode are attached via an electrically conductive material. Most preferably, an electrically conducive polymeric material, such as a conductive epoxy applied to the inner face or surface of the housing is used.

Edge coatings 420 suitable for certain embodiments of the present application are described in U.S. application Ser. No. 11/642,819, filed on Dec. 21, 2006 which is hereby incorporated by reference in its entirety.

Semiconductor Device Passivation

Semiconductor devices, such as segmented radiation detectors used in imaging applications (e.g. medical imaging), may be surface-passivated, for example to improve device reliability. Currently, passivation and encapsulation methods for single channel radiation detectors, are not practical for use with segmented multichannel monolithic radiation detectors for several reasons. For instance, single channel encapsulation procedures may not be compatible with the photolithography-based chemical fabrication processes needed for segmented detectors. Furthermore, certain passivation or encapsulation procedures may not be practical for large scale industrial production of segmented detectors. Even further, certain passivation techniques can only be applied on lower resistivity or narrow band-gap semiconductor materials. To that end, the present embodiments describe a method of forming a passivation layer on a semiconductor device. Such methods are practical for use with segmented radiation detectors as well as wide band-gap semiconductor materials. Specifically, in one aspect, the present embodiments describe a method of forming a passivation layer between anode pixels of a CZT or CdTe multichannel detector.

In one embodiment, a method of forming a passivation layer comprises contacting at least one surface of a wide band-gap semiconductor material with a passivating agent comprising an alkali hypochloride to form the passivation layer on the at least one surface of the material. Preferably the semiconductor material is incorporated into a radiation detector. For instance, the semiconductor material may be a semiconductor substrate having opposing front and rear surfaces where a cathode electrode is located on the front surface and a segmented anode electrode array is located on the rear surface of said semiconductor substrate, thus forming the detector. For example, and without any intent to limit the present embodiments, FIG. 1 illustrates a substrate 304 comprised of a semiconductor material (such as CdTe or CZT), which is incorporated into the radiation detector.

In the context of the present embodiments, "passivation layer" refers to an oxide formed on the surface of the semiconductor material. As a non-limiting example, a passivation layer formed on a CdTe or CZT surface may comprise tellurium oxide. In certain cases, the surface of a semiconductor material to be passivated may already contain an oxide layer prior to contacting a passivating agent. For instance, the oxide layer may be a native or a thermal oxide layer. In such cases, the passivation layer formed according to the present embodiments is one resulting from contacting the semiconductor material surface (oxidized and/or unoxidized) with a passivating agent.

The passivating agent preferably comprises an alkali hypochloride which assists in forming a passivation layer on at least one surface of the semiconductor material. For example, the alkali hypochloride comprises an alkali metal, such as, but not limited to sodium, and hypochloride. More preferably, the alkali hypochloride reacts with cadmium telluride or cadmium zinc telluride to form an oxide. One or more types of oxides, such as a metal oxide or an oxide of a II-VI semiconductor material, may form depending on the composition of the semiconductor material surface. Without wishing to be bound by a particular theory, it is believed that the passivation layer comprises tellurium oxide. However, it is possible that the passivation layer may be a mixture of cadmium oxide, zinc oxide and/or tellurium oxide on CZT, or a mixture of tellurium oxide, cadmium oxide and/or cadmium telluride on CZT. One benefit, among others, is that the passivation oxides formed according to the present embodiments generally degrade less over time compared to oxides formed with other techniques.

The passivating agent may be applied to, or contacted with, the semiconductor material using a variety of techniques. For instance, the passivating agent may be in an aqueous or non-aqueous solution. The semiconductor material is partially or fully immersed into this solution for a period of time sufficient to form an oxide layer. In some cases, the step of applying the passivation agent may immediately follow or precede other surface treatment steps such as an etching step. As an alternative to immersion, the passivating agent may be sprayed or otherwise deposited onto the semiconductor material.

In a non-limiting example, the steps relating to contacting a semiconductor material with a passivating agent are as follows:

(1) prepare a solution of NaOCl in a clean beaker; for example a 1%-5% NaClO in DI water for 5-15 min.

(2) gently immerse a CZT tile(s) comprising pixellated anodes on one surface into the solution, with the anodes facing upwards;

(3) leave the tile(s) in the solution for at least 5 minutes, such as 5-15 minutes;

(4) remove the tiles and immerse in DI water for at least 2 minutes using gentle agitation;

(5) dry the tile(s) by patting with an absorbent fabric and blow dry with air.

The steps of forming the cathode electrode and passivation layer(s) can be performed in either order. In one embodiment, both anode and cathode electrodes of a radiation detector are formed prior to forming the passivation layer. In another embodiment, the passivation layer is formed prior to forming the cathode electrode of a radiation detector, but after forming the anode electrodes. In such cases, it may be desirable to avoid forming a passivation layer on the face of the substrate where the cathode will be subsequently formed by covering the cathode surface with a mask or by etching the passivation from the cathode surface.

Figure 4A:
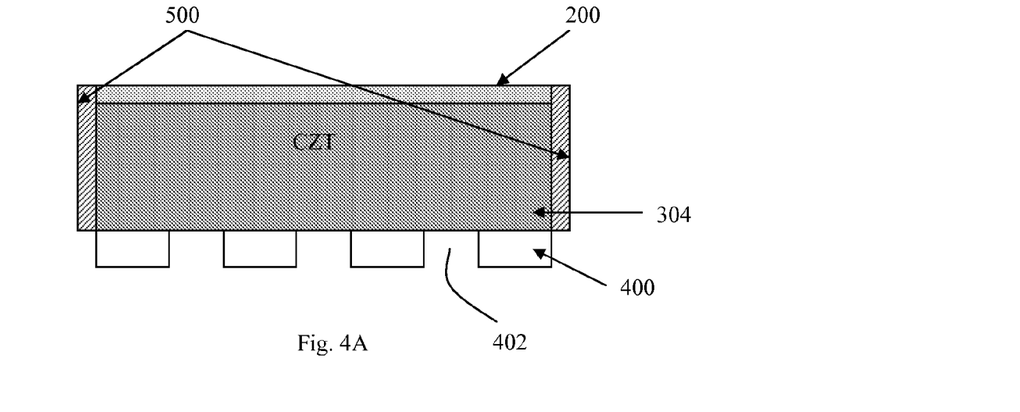
FIGS. 4A-C are cross-sectional views of a radiation detector with a passivation layer at various locations on the semiconductor substrate.
Figure 4B:
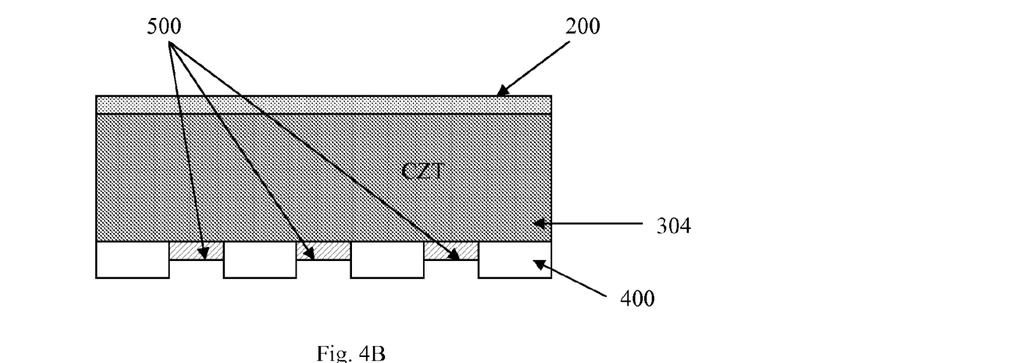
Figure 4C:
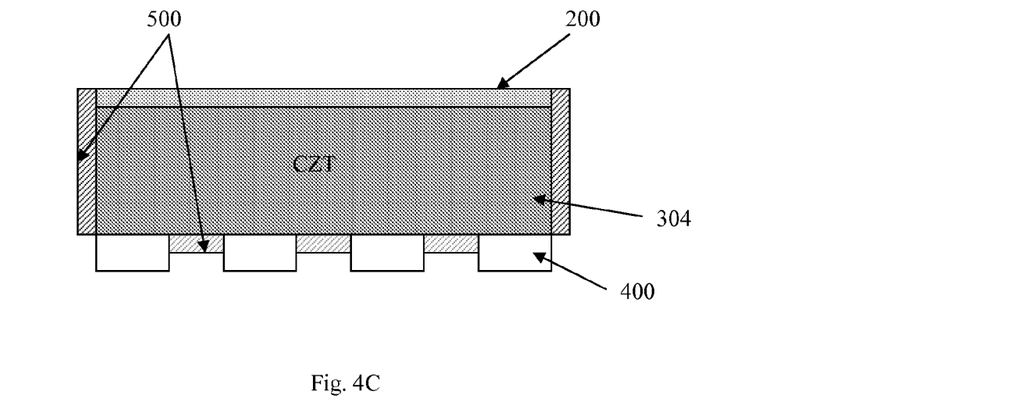

The passivation layer can be formed on various parts of a semiconductor material, which is incorporated into a radiation detector device. In one embodiment, the passivation layer is formed only at the interpixel regions. In another embodiment, the passivation layer is formed only on the sidewalls of the semiconductor material. In yet another embodiment, the passivation layer is formed both at the interpixel regions and on the sidewalls. These embodiments are exemplified, without any intent to limit the same, in FIGS. 4A-C. As shown in FIG. 4A, a semiconductor substrate 304 comprises a cathode 200, anode electrodes 400 and passivation layers 500 formed on the substrate 400 sidewalls. FIG. 4B is identical to FIG. 4A with the exception that passivation layer 500 is formed at the interpixel regions 402 (between the anode electrodes) instead of on the semiconductor substrate 304 sidewalls. The thickness of the passivation layer shown in FIG. 4B is smaller than the height of the anode electrodes 400. However, in certain cases, the passivation layer 500 may be at a height that is equal or taller than the height of the anode electrode 400. FIG. 4C represents a combination of FIGS. 4A and 4B where the detector comprises passivation layers 500 both at the interpixel regions 402 and on the semiconductor substrate sidewalls.

Referring to FIGS. 3A-C, a radiation detector may optionally comprise a cathode housing, as shown, in addition to passivation layer(s). Thus the edge coating 420 shown in FIG. 3B is not needed, if a passivation layer 500 is to be formed on the substrate sidewalls. For example, the passivation layer(s) may be formed on the substrate sidewalls and/or at the interpixel regions before attaching the cathode housing 425. Alternatively, the passivation layer on the substrate sidewalls may be formed first followed by attaching the cathode housing 425 and then forming the interpixel passivation layer. As yet another alternative, the cathode housing 425 may be entirely formed before the interpixel passivation layer.

Semiconductor Device Encapsulation

In one embodiment, the semiconductor devices comprise at least one a layer of an encapsulation material. Preferably, the encapsulation material encapsulates at least one passivation layer to protect the same. For example, a layer of encapsulation material can be applied onto to the passivation layer at the interpixel region to protect the passivation layer.

Examples of suitable encapsulation materials include, but are not limited to, aluminum oxide, aluminum nitride, aluminum oxynitride, parylene family of polymers (e.g. polyxylenes) and solder mask materials. Some solder mask materials may be chosen from a variety of photoimagable polymeric materials. Most preferably, the solder mask material comprises a UV-curable epoxy-based solder mask Solder masks are further described in U.S. application Ser. No. 11/642,819, filed on Dec. 21, 2006 which is hereby incorporated by reference in its entirely.

The solder mask material may be applied as a single continuous layer, several overlapping or butted layers or a combination thereof. The preferred methods of applying the solder mask are spray coating and dip coating.

A non-limiting example of the steps for forming a solder mask layer is as follows:

(1) Prepare an epoxy-based solder mask material with a suitable amount of thinner.

(2) Apply a layer of the solder mask material onto the anode face of a pixellated detector by spray-coating, spin-coating or dip-coating methods.

(3) Tack dry the layer at about 70-100° C., such as about 80-90° C., for a duration of about 15 minutes or more, such as about 20-30 minutes.

(4) UV-cure the solder mask layer at the interpixel area using photolithography, and develop the rest of the layer using a developer solution such as, for example 1-5% $Na_2CO_3$ solution.

(5) Cure the solder mask material at the interpixel region at about 120-150° C., such as at about 135-140° C., for a duration of about 0.5-2 hours, such as about 1-1.5 hours.

Figure 5A:
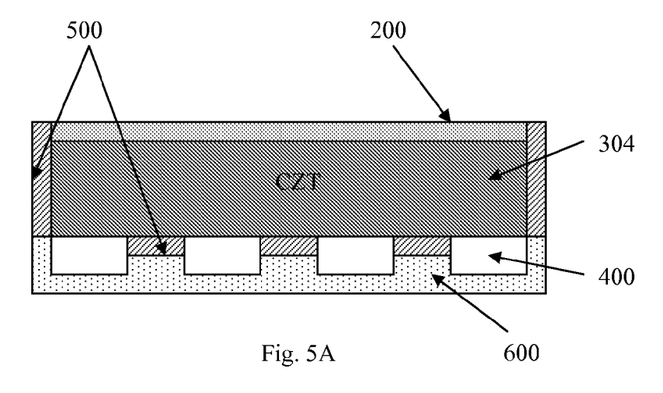
FIGS. 5A-5F are cross-sectional views of a radiation detector with at least one layer of an encapsulation material.
Figure 5B:
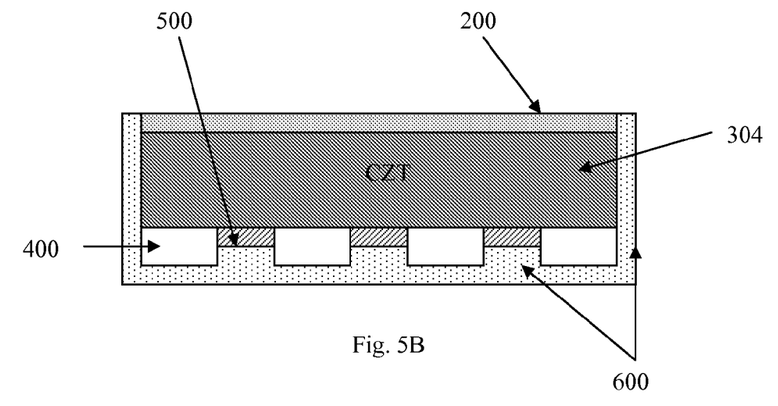

Semiconductor devices comprising an encapsulation layer are also exemplified in FIGS. 5A-F, which are not intended to limit the present embodiments in any way. In FIG. 5A, a radiation detector comprises passivation layers 500 on the anode interpixel regions 402 and on the semiconductor substrate 304 sidewalls. The encapsulation layer 600 covers the passivation layer 500 at the anode interpixel region 402 and layer 600 covers the anodes 400. Alternatively, in FIG. 5B, the encapsulation layer 600 covers the passivation layer 500 at the interpixel region 402, and encapsulation layer 600 covers the anodes 400 and the substrate 304 sidewalls. In yet another alternative, not shown, the encapsulation layer 600 may also cover passivation layers 500 on the substrate 304 sidewalls.

Figure 5C:
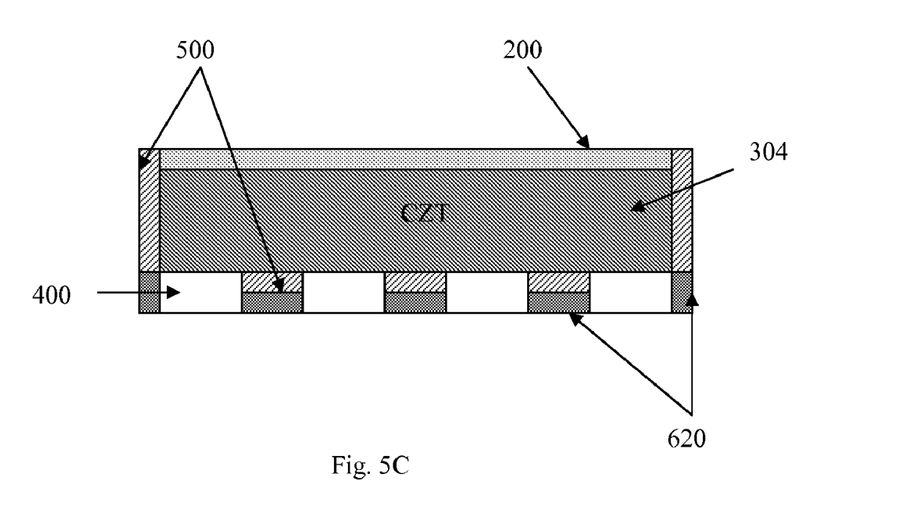
Figure 5D:
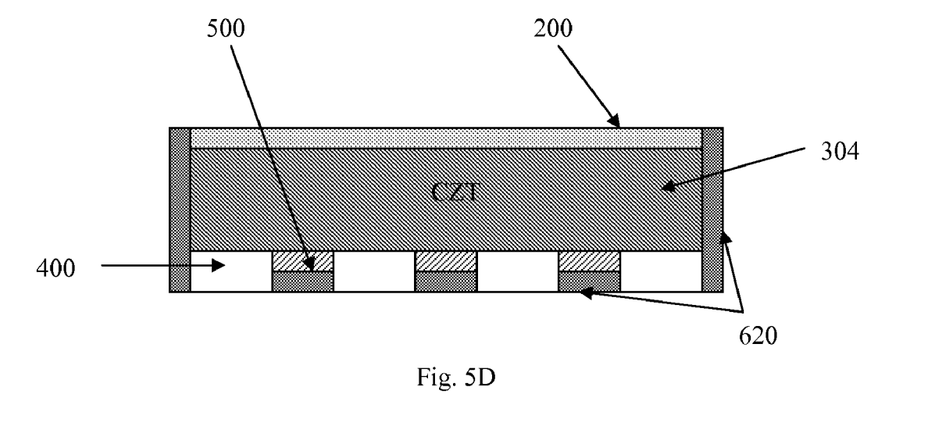
Figure 5E:
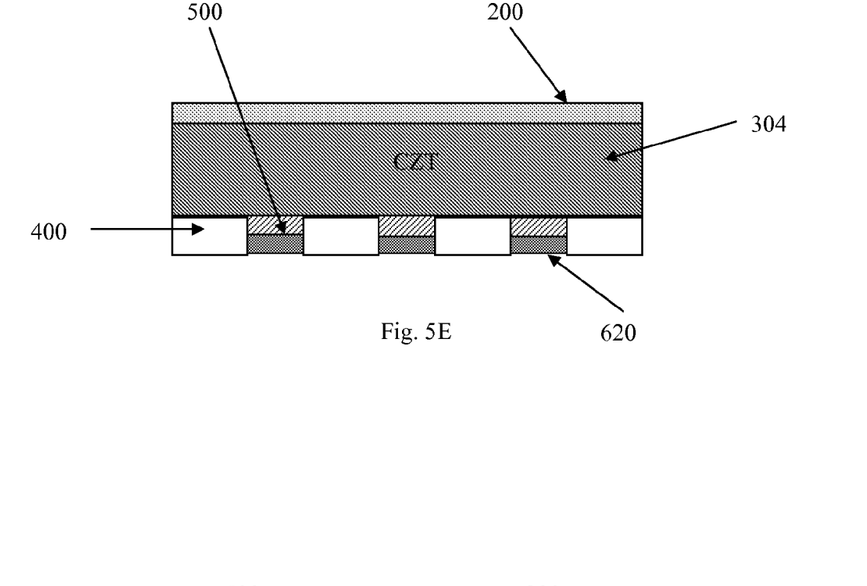
Figure 5F:
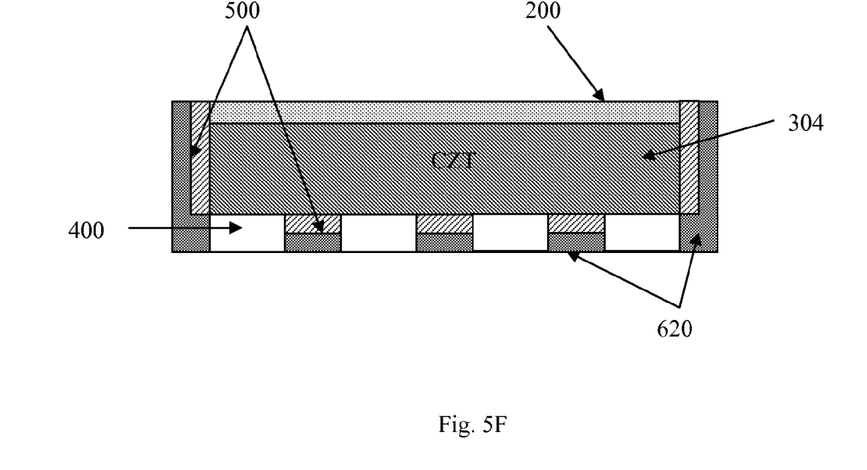

Following photolithography and curing steps, a portion of the encapsulation layer 600 remains, which is shown as the cured encapsulation layer 620 in FIGS. 5C-5F. As shown in FIGS. 5C and 5E, the cured encapsulation layer 620 protects the passivation layer 500 at the interpixel region 402 (in FIG. 5E the substrate 304 sidewall is exposed).

Alternatively, as shown in FIG. 5D, the cured encapsulation layer 620 protects the passivation layer 500 at the interpixel region 402 and also covers the substrate 304 sidewall. As yet another alternative, shown in FIG. 5F, the cured encapsulation layer 620 protects the passivation layer 500 at the interpixel region 402 and the passivation layer 500 on the substrate 304 sidewall.

The encapsulation methods described herein provide various added benefits. For example, the encapsulation can ensure long term reliability of passivated devices. This may be critical for applications such as medical imaging and homeland security, which can not afford failure or loss of accuracy. Another benefit, is that the passivation and encapsulation techniques of the present embodiments are compatible with commercial packaging and general use in the art.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention. All of the publications, patent applications and patents cited herein are incorporated herein by reference in their entirety.

What is claimed is:

1. A method of forming a passivation layer comprising:
    contacting at least one surface of a wide band-gap semiconductor material with a passivating agent comprising an alkali hypochloride to form the passivation layer on said at least one surface.

2. The method of claim 1, wherein semiconductor material comprises a semiconductor substrate.

3. The method of claim 2, wherein:
    the semiconductor substrate comprises a substrate of a multi-channel monolithic radiation detector;
    the semiconductor substrate has opposing front and rear surfaces;
    a cathode electrode is located on the front surface of said semiconductor substrate; and
    a segmented anode electrode array is located on the rear surface of said semiconductor substrate.

4. The method of claim 1, wherein the wide band-gap semiconductor material comprises a II-VI semiconductor substrate.

5. The method of claim 4, wherein the alkali hypochloride comprises NaOCl.

6. The method of claim 5, wherein the semiconductor material comprises cadmium telluride or cadmium zinc telluride.

7. The method of claim 4, wherein the passivation layer comprises an oxide of the II-VI semiconductor material.

8. The method of claim 3, wherein the passivation layer is formed at least between anode electrodes of the segmented anode electrode array.

9. The method of claim 3, wherein the passivation layer is formed at least on sidewalls of the substrate.

10. The method of claim 1, wherein the step of contacting comprises immersing the semiconductor material in a solution comprising the passivating agent.

11. A method of passivating a monolithic, multichannel semiconductor radiation detector comprising:
    providing a cadmium telluride or cadmium zinc telluride substrate having a segmented anode electrode array on a first surface of the substrate and a cathode electrode on a second surface of the substrate; and
    forming a passivation layer at least between the anode electrodes of the anode electrode array by contacting the first surface of the substrate with a solution comprising sodium hypochloride.

12. The method of claim 11, wherein the semiconductor substrate comprises cadmium zinc telluride.

13. The method of claim 11, wherein the step of contacting lasts between about 5 and about 60 minutes.

14. The method of claim 11, wherein a passivation layer is further formed on sidewalls of the substrate.

15. The method of claim 11, wherein the cathode electrode is formed before the passivation layer.

16. The method of claim 11, wherein the cathode electrode is formed after the passivation layer.

17. The method of claim 11, wherein a thickness of the passivation layer in between the anode electrodes is less than or equal to a height of the anode electrodes.

18. The method of claim 11, wherein the passivation layer comprises an oxide of cadmium telluride or an oxide of cadmium zinc telluride.

19. The method of claim 11, further comprising drying said first surface of the substrate.

20. A device formed according to the method of claim 1.

21. A device formed according to the method of claim 11.

* * * * *